United States Patent
Gründl et al.

(10) Patent No.: US 6,753,674 B2
(45) Date of Patent: Jun. 22, 2004

(54) HALF-BRIDGE SUBASSEMBLY

(75) Inventors: Andreas Gründl, München (DE);
Bernhard Hoffmann, Starnberg (DE)

(73) Assignee: Compact Dynamics GmbH, Starnberg (DE)

(*) Notice: Subject to any disclaimer, the term of this patent is extended or adjusted under 35 U.S.C. 154(b) by 0 days.

(21) Appl. No.: 10/311,817

(22) PCT Filed: Jun. 15, 2001

(86) PCT No.: PCT/EP01/06817
§ 371 (c)(1),
(2), (4) Date: Dec. 19, 2002

(87) PCT Pub. No.: WO01/99266
PCT Pub. Date: Dec. 27, 2001

(65) Prior Publication Data
US 2003/0137320 A1 Jul. 24, 2003

(30) Foreign Application Priority Data
Jun. 23, 2000 (DE) .......................... 100 30 875

(51) Int. Cl.⁷ .............................................. G05F 3/16
(52) U.S. Cl. ...................................... 323/224; 323/282
(58) Field of Search ................................ 323/222–225, 323/265, 282, 351

(56) References Cited

U.S. PATENT DOCUMENTS

| | | | |
|---|---|---|---|
| 4,965,710 A | * 10/1990 | Pelly et al. | ............... 363/56.03 |
| 5,544,038 A | 8/1996 | Fisher et al. | |
| 5,661,644 A | 8/1997 | Bergman et al. | |
| 5,814,884 A | 9/1998 | Davis et al. | |
| 5,966,291 A | * 10/1999 | Baumel et al. | ............. 361/707 |
| 6,323,539 B1 | * 11/2001 | Fujihira et al. | ............. 257/630 |
| 6,639,388 B2 | * 10/2003 | Tihanyi | ...................... 323/224 |

FOREIGN PATENT DOCUMENTS

| | | |
|---|---|---|
| DE | 40 27 969 C 1 | 9/1990 |
| DE | 42 30 510 C 1 | 9/1992 |
| EP | 0 339 963 | 11/1989 |
| EP | 0 867 943 A1 | 9/1998 |

* cited by examiner

*Primary Examiner*—Michael Sherry
*Assistant Examiner*—Gary L. Laxton
(74) *Attorney, Agent, or Firm*—Pierce Atwood

(57) ABSTRACT

Half-bridge assembly for switching electrical power, wherein at least two semiconductor switches are connected in series forming a half-bridge; each semiconductor switch comprises a control input, the first semiconductor switch comprises a first power terminal which can be connected with a high voltage potential; the second semiconductor switch comprises a second power terminal which can be connected with a low voltage potential; a second power terminal of each first semiconductor switch is connected with a first power terminal of the respective second semiconductor switch; each of the semiconductor switches comprises a free-wheeling diode which is located parallel to both power terminals of the respective semiconductor switch; and a Schottky diode is connected in parallel to each free-wheeling diode, each semiconductor switch with its free-wheeling diode and each Schottky diode is connected with a heat sink in a heat conductive manner, with the thermal resistance between each Schottky diode and the heat sink being dimensioned larger than the thermal resistance between each free-wheeling diode and the heat sink.

8 Claims, 1 Drawing Sheet

HALF-BRIDGE SUBASSEMBLY

DESCRIPTION

1. Background of the Invention

The invention relates to a half-bridge assembly for switching electrical power, wherein at least two semiconductor switches are connected in series forming a half-bridge. Each semiconductor switch comprises a control input. Furthermore, each first semiconductor switch has a first power terminal which can be connected with a high voltage potential, and each second semiconductor switch comprises a second power terminal which can be connected with a low voltage potential. A second power terminal of each first semiconductor switch is connected with a first power terminal of the respective second semiconductor switch. Finally, each of the semiconductor switches comprises a free-wheeling diode which is located parallel to both power terminals of the respective semiconductor switch.

2. State of the Art

Such a half-bridge assembly is known from DE-A-42 30 510. Such half-bridge arrangements are employed for the formation of inverters for the most different fields of application, such as e.g. for the supply of polyphase machines, permanent magnet motors and the like (see also e.g. DE-A-40 27 969).

In particular with FET power semiconductor switches, the free-wheeling diode is usually integrated with the semiconductor switch. The integrated free-wheeling diode is formed as a silicon junction diode. Such an integrated free-wheeling diode, however, has a relatively long switching time (in the order of 10 ns to several microseconds). This results in that a significant electrical power loss occurs in the integrated free-wheeling diode, which must be converted to heat and dissipated. At least for high electrical switching capacities, half-bridge arrangements are liquid-cooled. Due to the fact that the integrated free-wheeling diodes must possess a considerable current-carrying capacity, these also require considerable semiconductor areas and thus installation space.

In order to reduce the switching times of the diodes and thus the power loss, it has already been proposed to connect Schottky diodes in parallel with the integrated free-wheeling diodes—with the same polarity as the free-wheeling diodes—and to cool each semiconductor switch with its integrated free-wheeling diode and each Schottky diode, i.e. to connect them in a heat conductive manner with a heat sink. For avoiding parasitic inductances, the diodes must be arranged as close as possible to the semiconductor switch.

Schottky diodes have very short switching times, because they are provided with a metal semiconductor transition instead of a pn transition, which also comprises a rectifier effect. With the metal semiconductor transition, however, the stored charge is very small so that the switching time is very short. Another characteristic of Schottky diodes is the lower conducting-state voltage of approx. 0.3 V compared to silicon junction diodes.

The integrated free-wheeling diode is a silicon junction diode with a conduction-state voltage of approx. 0.7 V. Thus, in the free-wheeling operation of the half-bridge arrangement, virtually the total current flows via the Schottky diode because its conducting-state voltage is lower. The Schottky diode has switching times in the order to 10 to 100 ps. Thus the power loss to be converted to heat is also significantly reduced. Nevertheless, the Schottky diode, too, is cooled in the same manner as the power semiconductor switch with the integrated free-wheeling diode, because otherwise an overheating (above 170° C.) and thermal destruction would be expected.

This improvement of the switching behaviour also requires a corresponding dimensioning of the Schottky diodes because these must be capable of carrying the total current in the free-wheeling operation of the half-bridge arrangement.

From U.S. Pat. No. 5,661,644 a half-bridge assembly with two semiconductor switches connected in series is known. A free-wheeling diode is connected parallel to each semiconductor switch, and a Schottky diode is connected parallel to each free-wheeling diode. Further, the arrangement of semiconductor switches and free-wheeling diodes on a heat sink is known from this publication.

From DE 195 32 992 A1 a circuit board is known, one side of which is fitted with electric or electronic components, on whose backside a cooling plate is applied under the insertion of an intermediate layer. A component which can be subjected to high thermal loads is connected with the cooling plate via a heat conducting bridge.

From U.S. Pat. No. 6,055,148 a half-bridge assembly with a first semiconductor element arranged on a base plate is known. A Schottky diode is attached to the first semiconductor element by means of an adhesive layer.

From DE 196 24 475 A1 an apparatus for tempering electronic components is known which are arranged on a carrier installed in a housing. A body is arranged between the carrier and a housing wall, which has a closed elastic envelope with a heat conductive material located therein, which is in an essentially air tight contact with the carrier and the housing wall.

Problem on Which the Invention is Based

The invention is based on the problem to further increase the power density (switchable electric power referred to the installation volume) of such half-bridge arrangements and, in particular, to design them even more economic.

Inventive Solution

This problem is solved in a half-bridge arrangement of the above mentioned type in that the thermal resistance between each Schottky diode and the heat sink is dimensioned larger than the thermal resistance between each free-wheeling diode and the heat sink and the thermal coupling of the Schottky diode compared to the thermal coupling of the integrated free-wheeling diode is reduced such that the conducting-state voltage of the integrated free-wheeling diode, even under load, is invariably above the conducting-state voltage of the Schottky diode.

This means that the thermal coupling of the Schottky diode to the cooling medium is "poorer" than the thermal coupling of the integrated free-wheeling diode to the cooling medium.

The "thermal coupling to a cooling medium" in this context can both be the coupling to a (metallic) body and the coupling to a cooling liquid surrounding the semiconductor components.

This measure is contradictory to the usual approach to cool semiconductors as efficiently as possible.

Compared to the state of the art, it nevertheless permits a significantly smaller dimensioning of the Schottky diode with respect to its current-carrying capacity and thus the required semiconductor area because of the following circumstances: The diode characteristic of a Schottky diode is more temperature dependent than the characteristic of an integrated free-wheeling diode with silicon junction diode properties. Moreover, the characteristic of a Schottky diode includes a relatively high ohmic proportion. Upon current supply to the Schottky diode, it is heated to a greater extent because of the poorer cooling so that the conducting-state voltage of the Schottky diode decreases with increasing temperature. The consequence of this is that its characteristic is shifted by a greater amount due to the reduced cooling effect, so that the Schottky diode can take the current from the free-wheeling diode. It is understood that the arrangement as a whole (also with respect to the cooling of the Schottky diode) must be so dimensioned that no destruction of the semiconductors occurs.

If because of the lower heat coupling (and the higher thermal resistance resulting therefrom) between the Schottky diode and the cooling medium the Schottky diode is heated to a greater extent than the integrated free-wheeling diode, the consequence of this is that the conducting-state voltage of the integrated free-wheeling diode, even under load, is invariably above the conducting-state voltage of the Schottky diode. Consequently, in the free-wheeling operation of the half-bridge arrangement, the current always flows through the more rapidly switching Schottky diode.

Advantages of the Invention

Through the inventive construction of the half-bridge assembly a particularly compact arrangement is achieved which enables a packing density which cannot be compared with previous solutions. Compared to previous designs, a reduction of the semiconductor area of the Schottky diodes by approx. 66 percent is possible. This allows to both to keep the required volume of cooling medium or cooling liquid, respectively, small referred to the total volume and to achieve a miniaturisation of the overall arrangement which will render the employment of the invention, in particular also in mobile applications, very economic.

Further Embodiments of the Invention

In a presently preferred embodiment of the invention a ceramic platelet or a synthetic material layer is arranged between the Schottky diode and a cooling body for the Schottky diode, with a copper plating being provided on both sides, if required, while the semiconductor switch with its integrated free-wheeling diode is thermally coupled directly with the cooling body. It is, however, also possible to select a cooling body for the Schottky diode which in fact is directly thermally connected with the Schottky diode (in the same manner as the semiconductor switch with its integrated free-wheeling diode), but itself has a higher thermal resistance against its environment (liquid or air stream) than the cooling body for the semiconductor switch with its integrated free-wheeling diode.

In order to ensure that also in the "start-up" phase of the circuit, i.e. with cold semiconductors and cold cooling medium, the integrated free-wheeling diode of the semiconductor switch cannot be destroyed by a high power current surge, it is advantageous to provide a "warm-up phase" prior to the actual operation of the half-bridge arrangement. During this warm-up phase a current flows through the Schottky diode which, though it results in heating of the Schottky diode and possibly also of the integrated free-wheeling diode, does not lead to its destruction. As soon as the Schottky diode is sufficiently heated, the current, even under full load operation, cannot overload the Schottky diode because its conducting-state voltage will then be sufficiently low.

Due to the fact that for the operation of the half-bridge arrangement or the driving of the consumer connected with the half-bridge arrangement (e.g. asynchronous motor) a control circuit with a control computer is required in order to correspondingly supply the individual phases with current, a program for this warm-up phase can be stored in the control computer. By this control computer program for the warm-up phase the half-bridge arrangement is operated in such a manner that the current through the Schottky diode in the free-wheeling operation remains reduced until the Schottky diode is heated compared to the semiconductor switch and its integrated free-wheeling diode to such an extent that the conducting-state voltage of the integrated free-wheeling diode, even under load, is invariably above the conducting-state voltage of the Schottky diode.

In a preferred embodiment the semiconductor switches are formed by rapidly switching, low-loss field effect transistors (FET's). Several pairs of semiconductor switches connected in series can be connected in parallel. Moreover, the semiconductor switches can be formed by a great number of individual semiconductor switch elements with small switching capacities each. By utilising numerous semiconductor switch elements with relatively small switching capacities each, but which can be connected in parallel in a simple manner, a good cooling effect can be achieved because the numerous individual components can readily be reached by the cooling medium.

The invention also relates to a power final stage of a control device for a polyphase electric motor, wherein a half-bridge arrangement is provided for each phase of the electric motor.

SHORT DESCRIPTION OF THE DRAWING

The drawing illustrates a preferred embodiment of the subject matter of the invention.

DESCRIPTION OF AN EMBODIMENT OF THE INVENTION

Figure 1:
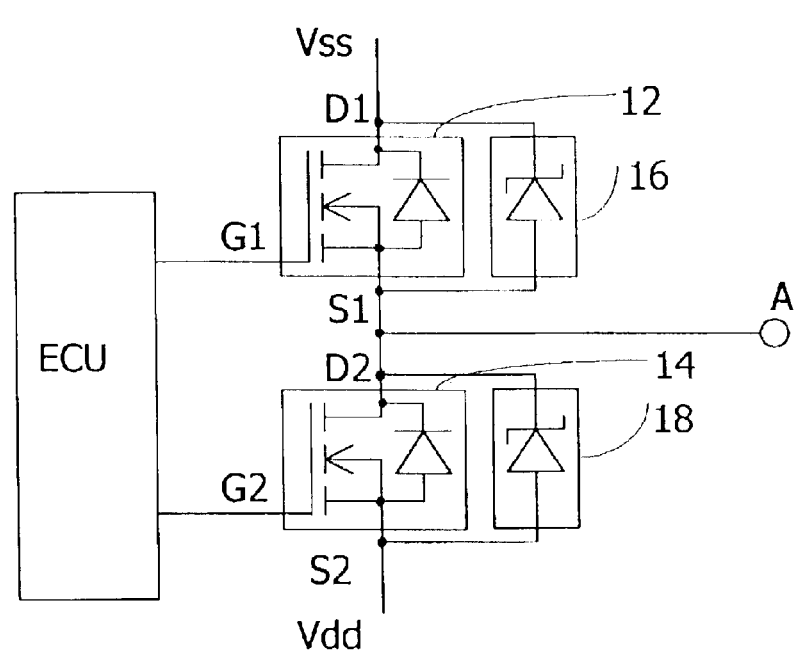
FIG. 1 shows an electric circuit diagram of an inventive halfbridge arrangement.

FIG. 1 shows a half-bridge 10 which comprises a pair of n-channel MOSFET's 12, 14 connected in series. The source terminal S1 (=first power terminal) of the first MOSFET 12 is connected with a high voltage potential $V_{SS}$. The drain terminal D2 (=second power terminal) of the second MOSFET 14 is connected with a low voltage potential $V_{DD}$. For forming an output A of the half-bridge the drain terminal D1 (=second power terminal) of the first MOSFET 12 and the source terminal S2 (=first power terminal) of the second MOSFET 14 are connected with each other. One control input each G1, G2 is provided for the two MOSFET's 12, 14 which are driven via gate resistors (not shown in detail) by a drive circuit ECU.

Between the high and the low voltage potentials $V_{SS}$ and $V_{DD}$ a backup capacitor (not shown in detail) is provided. The respective MOSFET's 12, 14 are driven by a (pulse width modulated) control signal with a switching frequency of more than 20 kHz. Preferably, the switching frequency is 100 kHz and above.

The two MOSFET's 12, 14 comprise integrated free-wheeling diodes which have silicon junction diode properties. According to the invention Schottky diodes 16, 18 are connected in parallel with the integrated free-wheeling diodes of the two MOSFET's 12, 14, with the Schottky diodes 16, 18 having the same orientation as the integrated free-wheeling diodes.

Figure 2:
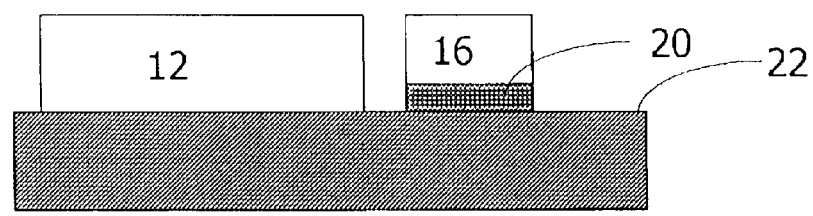
FIG. 2 is a schematic side view of a semiconductor switch with integrated free-wheeling diode as well as a Schottky diode connected in parallel of an inventive half-bridge arrangement according to FIG. 1 arranged on a cooling body.

As shown in FIG. 2 each MOSFET 12 with its integrated free-wheeling diode is directly coupled to a cooling body 22 in a heat conductive fashion. The associated Schottky diode 16 connected in parallel is also connected with the cooling body 22, but a ceramic platelet 20 is arranged between the Schottky diode 16 and the cooling body 22, so that the heat conduction between the MOSFET 12 with its integrated free-wheeling diode and the cooling body 22 is better than between the Schottky diode 16 and the cooling body 22.

In FIG. 2, this arrangement is shown only with respect to the first MOSFET 12 with its integrated free-wheeling diode and the Schottky diode 16 connected in parallel. It is understood, however, that this inventive arrangement is also applicable to the second MOSFET 14 with its integrated free-wheeling diode and the Schottky diode 18 connected in parallel.

What is claimed is:

1. A half-bridge assembly for switching electrical power, wherein
    at least two semiconductor switches (12, 14) are connected in series forming a half-bridge;
    each semiconductor switch (12, 14) comprises a control input (G1, G2),
    the first semiconductor switch (12) comprises a first power terminal (S1) which can be connected with a high voltage potential ($V_{SS}$);
    the second semiconductor switch (14) comprises a second power terminal (D2) which can be connected with a low voltage potential ($V_{DD}$);
    a second power terminal (D1) of each first semiconductor switch (12) is connected with a first power terminal (S2) of the respective second semiconductor switch (14);
    each of the semiconductor switches (12, 14) comprises a free-wheeling diode which is located parallel to both power terminals (D1, S1; D2, S2) of the respective semiconductor switch (12, 14); and
    a Schottky diode (16, 18) is connected in parallel to each free-wheeling diode,
    each semiconductor switch (12, 14) with its free-wheeling diode and each Schottky diode (16, 18) is connected with a heat sink (22) in a heat conductive manner, with the thermal resistance between each Schottky diode (16, 18) and the heat sink (22) being dimensioned larger than the thermal resistance between each free-wheeling diode and the heat sink (22) and with the thermal coupling of the Schottky diode (16, 18) compared to the thermal coupling of the integrated free-wheeling diode being reduced such that the conducting-state voltage of the integrated free-wheeling diode, even under load, is invariably above the conducting-state voltage of the Schottky diode (16, 18).

2. The half-bridge arrangement according to claim 1, characterised in that the semiconductor switches (14, 22; 24, 18, 26; 20, 28) are formed by field effect transistors (FET's) or insulated gate bipolar transistors (IGBT's).

3. The half-bridge arrangement according to claim 1, characterised in that the Schottky diode (16, 18) is operated on a higher temperature level compared to the free-wheeling diode.

4. The half-bridge arrangement according to claim 1, characterised in that a platelet or a synthetic material layer is arranged between the Schottky diode (16, 18) and a cooling body acting as the heat sink (22) for the Schottky diode, with a copper plating being provided on both sides, if required, while the semiconductor switch with its integrated free-wheeling diode is thermally coupled directly with the cooling body.

5. The half-bridge arrangement according to claim 1, characterised in that the Schottky diode is thermally coupled with a cooling body which is directly thermally connected with the Schottky diode but has a higher thermal resistance against its environment than the cooling body for the semiconductor switch with its integrated free-wheeling diode.

6. The half-bridge arrangement according to claim 1, characterised in that for a warm-up phase of the half-bridge arrangement the current through the Schottky diode in the free-wheeling operation remains reduced until the Schottky diode is heated compared to the semiconductor switch and its integrated free-wheeling diode to such an extent that the conducting-state voltage of the integrated free-wheeling diode, even under load, is invariably above the conducting-state voltage of the Schottky diode.

7. The half-bridge arrangement according to claim 1, characterised in that several pairs of semiconductor switches connected in series are connected in parallel.

8. The half-bridge arrangement according to claim 1, characterised in that the semiconductor switches are formed by a great number of individual semiconductor switch elements with small switching capacities each.

* * * * *